United States Patent
Kim et al.

(10) Patent No.: US 10,199,366 B2
(45) Date of Patent: Feb. 5, 2019

(54) METHODS OF MANUFACTURING SEMICONDUCTOR PACKAGES

(71) Applicant: SAMSUNG ELECTRONICS CO., LTD., Suwon-si, Gyeonggi-do (KR)

(72) Inventors: Seungwon Kim, Hwaseong-si (KR); Su-Jin Kwon, Hwaseong-si (KR); Junwon Han, Seoul (KR); Hyunwoo Kim, Seongnam-si (KR); Byung Lyul Park, Seoul (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 13 days.

(21) Appl. No.: 15/627,536

(22) Filed: Jun. 20, 2017

(65) Prior Publication Data

US 2018/0108644 A1    Apr. 19, 2018

(30) Foreign Application Priority Data

Oct. 18, 2016    (KR) .................. 10-2016-0135277

(51) Int. Cl.
*H01L 25/00* (2006.01)
*H01L 21/48* (2006.01)
*H01L 21/56* (2006.01)

(52) U.S. Cl.
CPC .......... *H01L 25/50* (2013.01); *H01L 21/4857* (2013.01); *H01L 21/56* (2013.01)

(58) Field of Classification Search
CPC ................ H01L 25/50; H01L 21/4857
See application file for complete search history.

(56) References Cited

U.S. PATENT DOCUMENTS

| 5,476,566 A | 12/1995 | Cavasin |
| 9,214,450 B2 | 12/2015 | Wu |
| 2005/0147489 A1 | 7/2005 | Chen et al. |
| 2014/0048906 A1 | 2/2014 | Shim et al. |
| 2014/0116615 A1* | 5/2014 | Ogawa .................. C09J 143/04 156/275.5 |
| 2014/0131858 A1 | 5/2014 | Pan et al. |
| 2014/0353823 A1* | 12/2014 | Park .................... H01L 23/3128 257/737 |
| 2015/0069623 A1 | 3/2015 | Tsai et al. |
| 2015/0187742 A1* | 7/2015 | Kwon ..................... H01L 24/82 257/774 |
| 2015/0206916 A1* | 7/2015 | Lee .................... H01L 27/14632 257/433 |
| 2015/0235989 A1 | 8/2015 | Yu et al. |
| 2016/0056057 A1 | 2/2016 | Yu et al. |
| 2016/0148857 A1 | 5/2016 | Lin et al. |

* cited by examiner

*Primary Examiner* — Errol Fernandes
(74) *Attorney, Agent, or Firm* — Lee & Morse, P.C.

(57) ABSTRACT

A method of manufacturing a semiconductor package, the method including forming a hole that penetrates an interconnect substrate; providing a first carrier substrate below the interconnect substrate; providing a semiconductor chip in the hole; forming a molding layer by coating a molding composition on the semiconductor chip and the interconnect substrate; adhering a second carrier substrate onto the molding layer with an adhesive layer; removing the first carrier substrate to expose a bottom surface of the semiconductor chip and a bottom surface of the interconnect substrate; forming a redistribution substrate below the semiconductor chip and the interconnect substrate; detaching the second carrier substrate from the adhesive layer; and removing the adhesive layer.

9 Claims, 10 Drawing Sheets

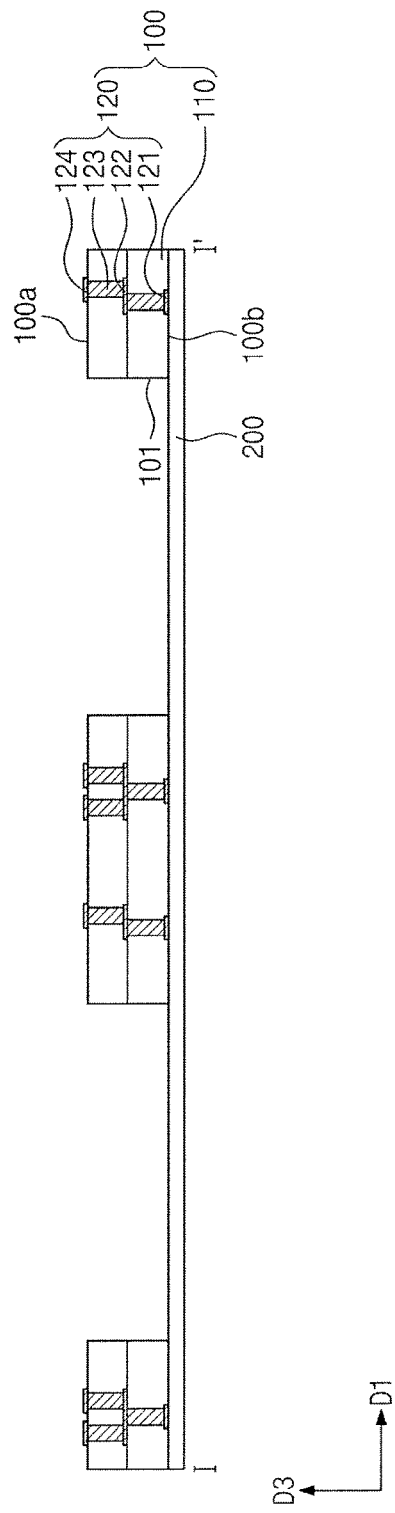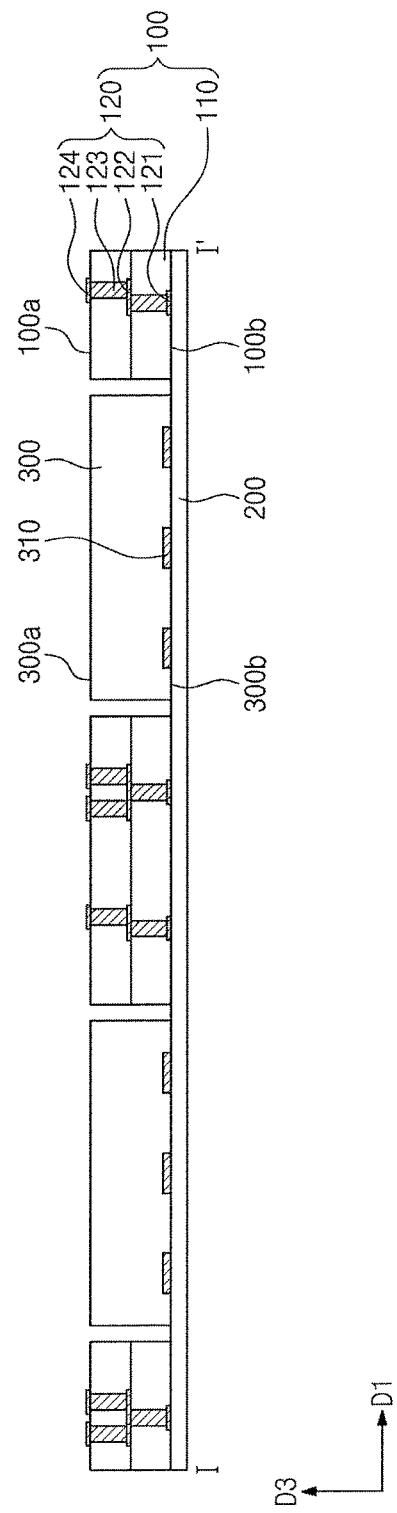

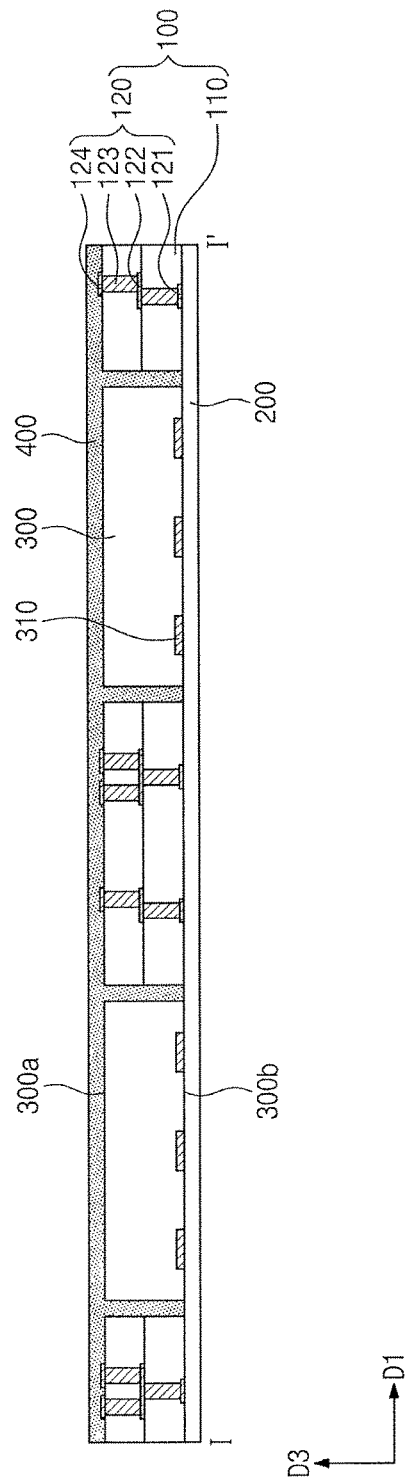
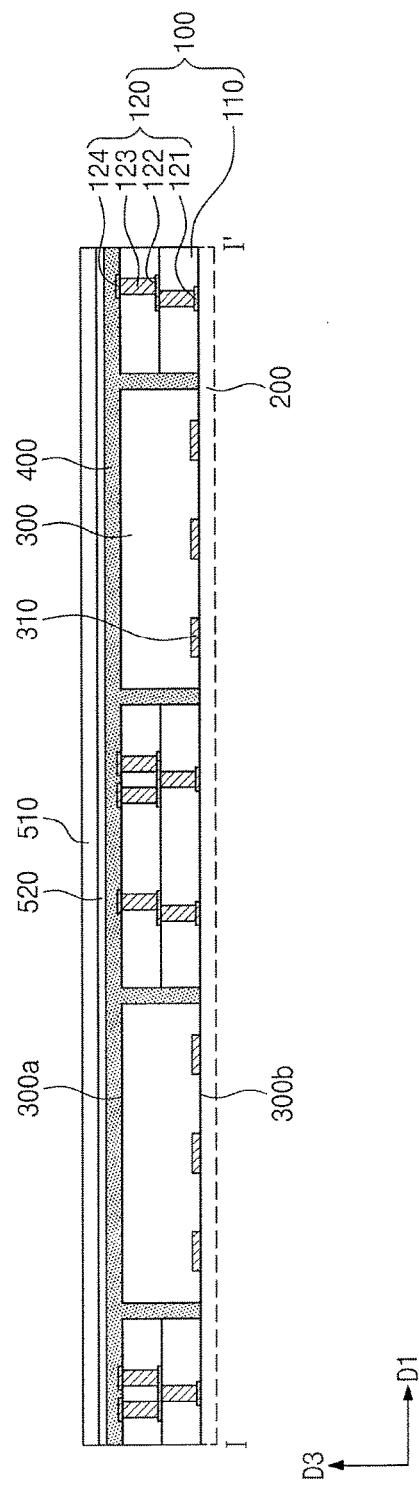

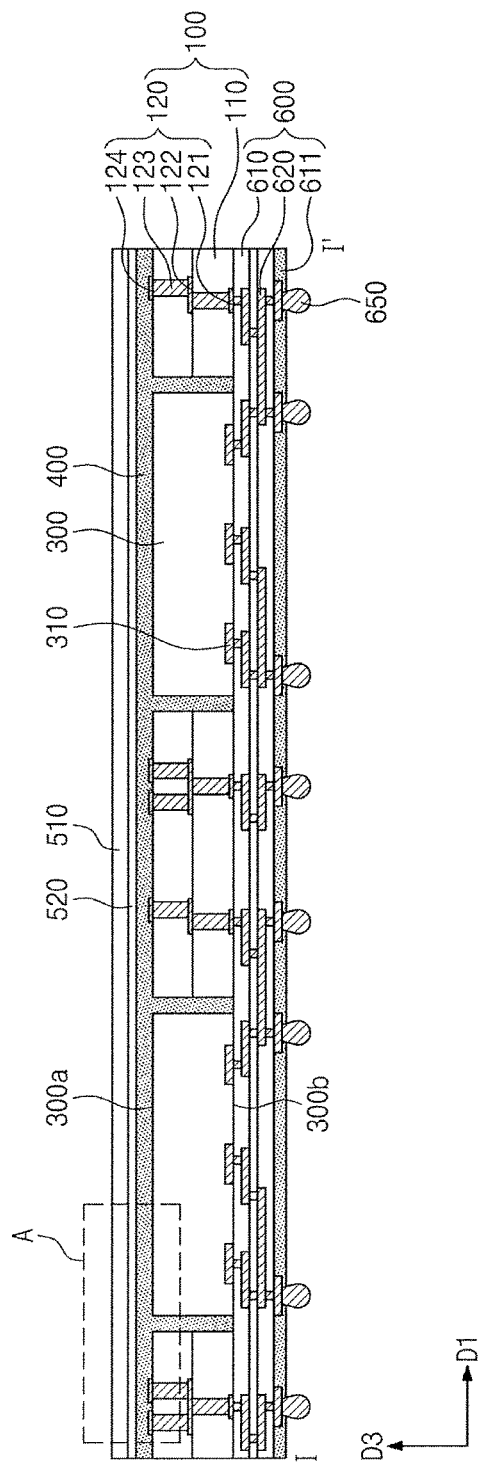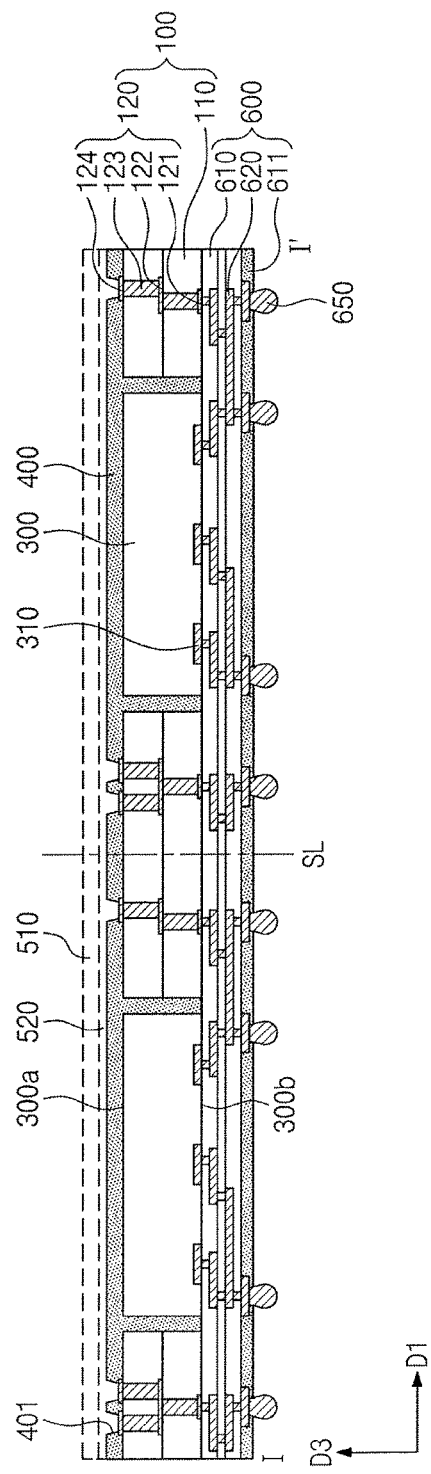

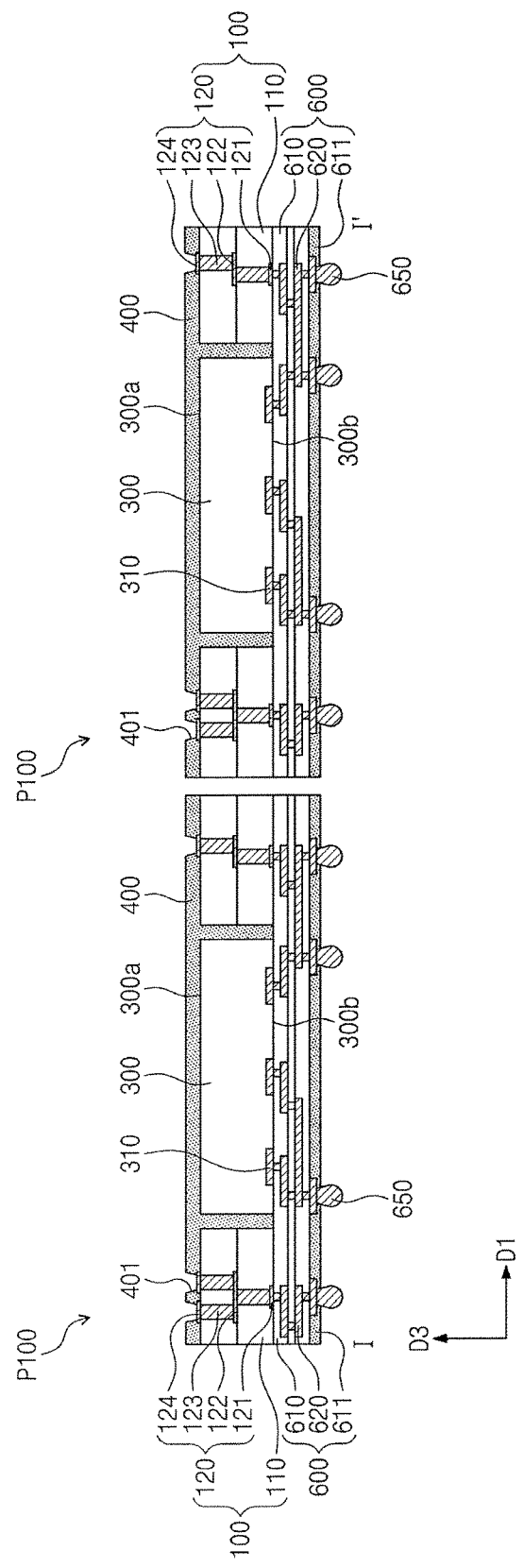

METHODS OF MANUFACTURING SEMICONDUCTOR PACKAGES

CROSS-REFERENCE TO RELATED APPLICATION

Korean Patent Application No. 10-2016-0135277, filed on Oct. 18, 2016, in the Korean Intellectual Property Office, and entitled: "Methods of Manufacturing Semiconductor Packages," is incorporated by reference herein in its entirety.

BACKGROUND

1. Field

The present disclosure relates to a method of manufacturing a semiconductor package.

2. Description of the Related Art

A semiconductor package may be provided to implement an integrated circuit chip to be suitable for use in electronic products. With the recent development of the electronic industry, the semiconductor package may be variously developed to reach the goal of compact size, light weight, and/or low manufacturing cost. A size of a semiconductor chip may become smaller with an increase in integration of the semiconductor chip.

SUMMARY

The embodiments may be realized by providing a method of manufacturing a semiconductor package, the method including forming a hole that penetrates an interconnect substrate; providing a first carrier substrate below the interconnect substrate; providing a semiconductor chip in the hole; forming a molding layer by coating a molding composition on the semiconductor chip and the interconnect substrate; adhering a second carrier substrate onto the molding layer with an adhesive layer; removing the first carrier substrate to expose a bottom surface of the semiconductor chip and a bottom surface of the interconnect substrate; forming a redistribution substrate below the semiconductor chip and the interconnect substrate; detaching the second carrier substrate from the adhesive layer; and removing the adhesive layer.

The embodiments may be realized by providing a method of manufacturing a semiconductor package, the method including providing an interconnect substrate; providing a molding layer on the interconnect substrate such that the molding layer fixes semiconductor chips; providing an adhesive layer and a carrier substrate on the molding layer; forming a redistribution substrate on the interconnect substrate and the semiconductor chips; forming a protrusion on the adhesive layer that protrudes from a top surface of the adhesive layer; detaching the carrier substrate from the adhesive layer; and removing the adhesive layer.

The embodiments may be realized by providing a method of manufacturing a semiconductor package, the method including providing an interconnect substrate and a semiconductor chip on a first carrier substrate; forming a molding layer by coating a molding composition on the semiconductor chip and the interconnect substrate; adhering a second carrier substrate onto the molding layer with an adhesive layer; removing the first carrier substrate to expose a surface of the semiconductor chip and the interconnect substrate; forming a redistribution substrate on the exposed surfaces of the semiconductor chip and interconnect substrate; detaching the second carrier substrate from the adhesive layer by reducing a contact area between the adhesive layer and the second carrier substrate; and removing the adhesive layer.

BRIEF DESCRIPTION OF THE DRAWINGS

Features will be apparent to those of skill in the art by describing in detail exemplary embodiments with reference to the attached drawings in which:

FIGS. 2A to 2J illustrate cross-sectional views of stages in a method of manufacturing a semiconductor package according to exemplary embodiments of the present disclosure.

DETAILED DESCRIPTION

It will be described hereinafter a method of manufacturing a semiconductor package according to exemplary embodiments of the present disclosure.

Figure 1A:
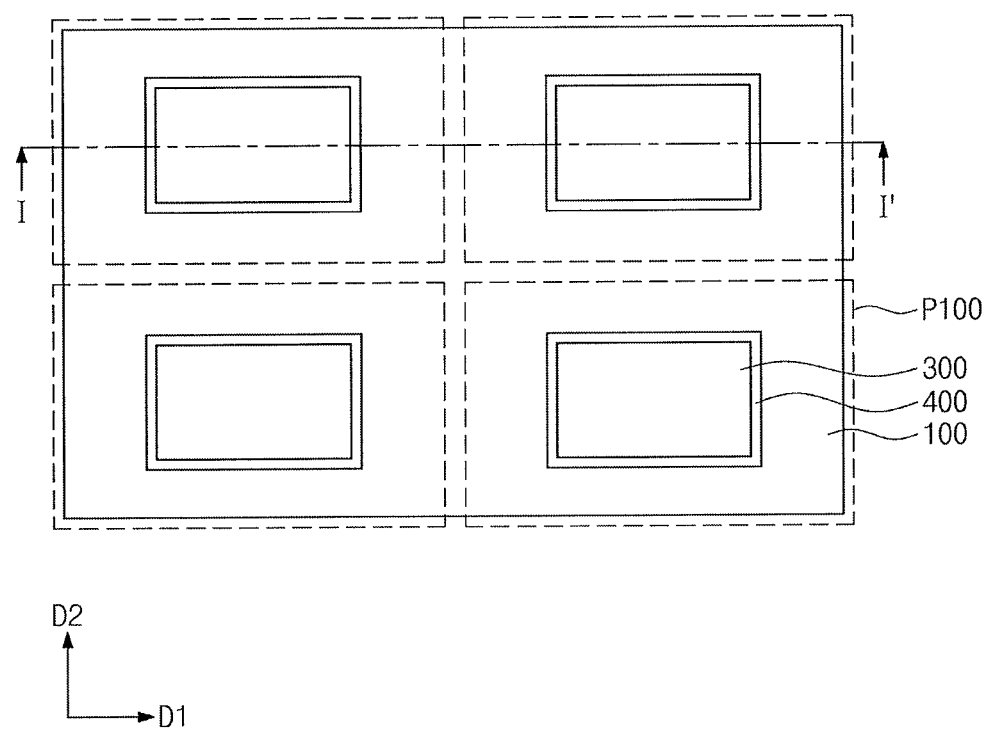
FIG. 1A illustrates a plan view of a stage in a method of manufacturing a semiconductor package according to exemplary embodiments of the present disclosure.
Figure 1B:
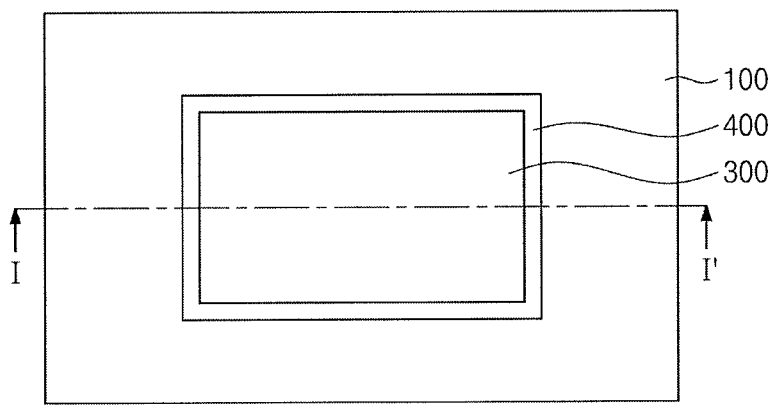
FIG. 1B illustrates a plan view of a first package according to exemplary embodiments of the present disclosure.
Figure 1B:
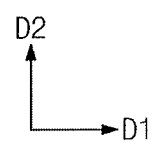

FIG. 1A illustrates a plan view of a stage in method of manufacturing a semiconductor package according to exemplary embodiments of the present disclosure. FIG. 1B illustrates a plan view of a first package according to exemplary embodiments of the present disclosure. FIGS. 2A to 2J illustrate cross-sectional views of stages in a method of manufacturing a semiconductor package according to exemplary embodiments of the present disclosure. FIGS. 2A to 2I correspond to cross-sectional views taken along line I-I' of FIG. 1A, and FIG. 2J corresponds to a cross-sectional view taken along line II-II' of FIG. 1B.

Figure 2A:
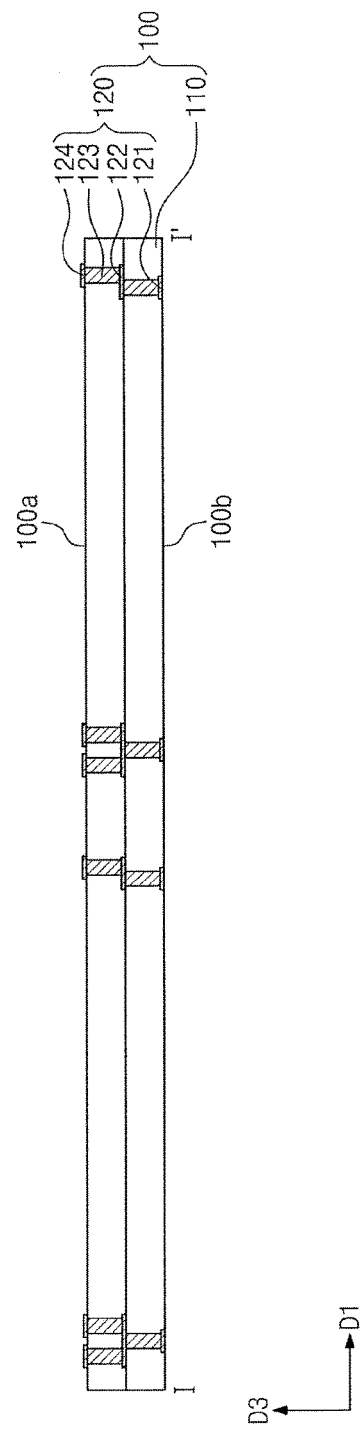

Referring to FIGS. 1A and 2A, an interconnect substrate 100 may be provided. The interconnect substrate 100 may include base layers 110 and a conductive member or plug 120 in the base layers 110. For example, a printed circuit board (PCB) may be used as the interconnect substrate 100. The conductive plug 120 may include, e.g., a lower pad 121 (e.g., lower pads), an interconnect line pattern 122, a via 123 (e.g., vias), and an upper pad 124 (e.g., upper pads). The lower pad 121 may be disposed on or at a bottom surface 100b of the interconnect substrate 100. The vias 123 may penetrate at least one of the base layers 110. The interconnect line pattern 122 may be interposed between the base layers 110 and may be coupled to the vias 123. The upper pad 124 may be provided on a top surface 100a of the interconnect substrate 100 and may be connected to at least one via 123. The upper pad 124 may be electrically connected to the lower pad 121 through the interconnect line pattern 122 and the vias 123. The upper pad 124 may not be aligned with the lower pad 121 in a third direction D3 (e.g., the upper pad 124 may be laterally offset relative to the lower pad 121). In this description, the third direction D3 may be a perpendicular or orthogonal direction to the bottom surface 100b of the interconnect substrate 100, and first and second directions D1 and D2 may be parallel directions to the bottom surface 100b of the interconnect substrate 100. The first direction D1 may cross the second direction D2.

Figure 2B:
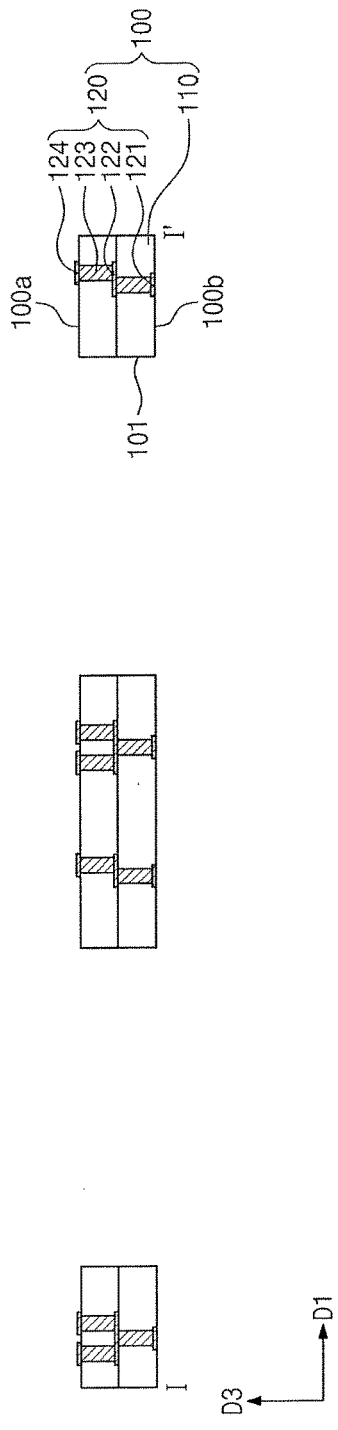

Referring to FIGS. 1A and 2B, a hole 101 may be formed in the interconnect substrate 100. The hole 101 may penetrate the interconnect substrate 100 in the third direction D3 and be formed by removing a portion of the interconnect substrate 100. In an implementation, the formation of the hole 101 may be achieved by performing, e.g., an etch process, a drilling process, a laser ablation process, or a laser cutting process. The removed portion of the interconnect substrate 100 may be a space where a first semiconductor chip (see 300 of FIG. 2D) is to be provided in a subsequent process. The hole 101 may have an open hole shape connecting with the top and bottom surfaces 100a and 100b of the interconnect substrate 100.

Referring to FIGS. 1A and 2C, the interconnect substrate 100 may be provided on a first carrier substrate 200. The interconnect substrate 100 may be adhered onto the first carrier substrate 200. For example, the first carrier substrate 200 may include an adhesive tape. In an implementation, an adhesive layer may further be provided between the first carrier substrate 200 and the interconnect substrate 100.

Referring to FIGS. 1A and 2D, a first semiconductor chip 300 may be provided on the first carrier substrate 200. The first semiconductor chip 300 may be provided on a portion of the first carrier substrate 200 that is exposed through the hole 101 of the interconnect substrate 100. The first semiconductor chip 300 may be adhered onto the first carrier substrate 200. The first semiconductor chip 300 may include first chip pads 310 at its lower portion. For example, the first chip pads 310 may face the first carrier substrate 200. The first semiconductor chip 300 may include, e.g., silicon (Si). In an implementation, the arrangement of the first semiconductor chip 300 shown in FIG. 2D may be carried out prior to that of the interconnect substrate 100 shown in FIG. 2C. In this case, the first semiconductor chip 300 may be disposed on the first carrier substrate 200, and then the interconnect substrate 100 may be disposed on the first carrier substrate 200 so as to align the hole 101 with the first semiconductor chip 300.

Referring to FIGS. 1A and 2E, a first molding layer 400 may be formed on the first carrier substrate 200. For example, a molding composition may be coated on the interconnect substrate 100 and the first semiconductor chip 300, and then the molding composition may be solidified to form the first molding layer 400. The first molding layer 400 may cover the top surface 100a of the interconnect substrate 100 and a top surface 300a of the first semiconductor chip 300. The molding composition may flow between the interconnect substrate 100 and the first semiconductor chip 300, so that the first molding layer 400 may fill between the interconnect substrate 100 and the first semiconductor chip 300. In an implementation, the molding composition may include an ABF (Ajinomoto Build-up Film). In an implementation, the molding composition may include an insulating polymer such as an epoxy polymer or a polymer material such as a thermosetting resin.

Referring to FIGS. 1A and 2F, a second carrier substrate 510 may be provided on the first molding layer 400. For example, an adhesive layer 520 may be used to adhere the second carrier substrate 510 onto the first molding layer 400. The adhesive layer 520 may include a foamable adhesive. For example, the adhesive layer 520 may include an ultraviolet (UV) or heat blowing agent. The second carrier substrate 510 may be a stiff or rigid substrate. In an implementation, the second carrier substrate 510 may include a transparent substrate such as a glass substrate. In an implementation, when the adhesive layer 520 includes a heat blowing agent, the second carrier substrate 510 may include a solid polymer substrate. During forming a first substrate 600 on the bottom surface 100b of the interconnect substrate 100 and the bottom surface 300b of the first semiconductor chip 300 in a subsequent process, the second carrier substrate 510 may support the interconnect substrate 100 and the first semiconductor chip 300 and to help prevent warpage of the interconnect substrate 100.

Thereafter, as shown by a dotted line in FIG. 2F, the first carrier substrate 200 may be removed to expose the bottom surface 300b of the first semiconductor chip 300 and the bottom surface 100b of the interconnect substrate 100. When an adhesive layer is present on the first carrier substrate 200, the adhesive layer may also be removed together with the first carrier substrate 200.

Referring to FIGS. 1A and 2G, a first substrate 600 may be formed or attached below or on the first semiconductor chip 300 and the interconnect substrate 100. For example, insulating patterns 610 and a conducive pattern 620 may be formed on the bottom surface 300b of the first semiconductor chip 300 and the bottom surface 100a of the interconnect substrate 100, thereby fabricating the first substrate 600. The first substrate 600 may be a redistribution substrate. The conductive pattern 620 may include a conductive layer between the insulating patterns 610 and a via penetrating the insulating patterns 610. The conductive pattern 620 may be coupled to the first chip pads 310 of the first semiconductor chip 300 and the lower pads 121 of the interconnect substrate 100. A protection layer 611 may be formed on a bottom surface of the first substrate 600. In an implementation, the protection layer 611 may include the same material as that of the first molding layer 400. As the first substrate 600 is used as a redistribution substrate, the first substrate 600 may have a thickness less than that of a printed circuit board (PCB). Accordingly, a semiconductor package may become compact-sized.

Outer terminals 650 may be formed on the bottom surface of the first substrate 600 such that the conductive patterns 620 may be coupled to the outer terminals 650. At least some of the outer terminals 650 may not be aligned with the upper pads 124 in the third direction D3. The number of the outer terminals 650 may be different from that of the upper pads 124. The outer terminals 650 may be electrically connected to the upper pads 124 through the conductive pattern 620, the lower pads 121, the interconnect line pattern 122, and the vias 123. The interconnect line pattern 122 may be provided in the interconnect substrate 100, so that the upper pads 124 may not be aligned with the lower pads 121 in the third direction D3. It thus may be possible to help reduce limitation of the arrangement and the number of the conductive pattern 620 in the first substrate 600.

Referring to FIGS. 1A and 2H, the adhesive layer 520 and the second carrier substrate 510 may be detached from the first molding layer 400. For example, after the second carrier substrate 510 is detached from the adhesive layer 520, the adhesive layer 520 may be removed from the first molding layer 400.

Figure 3A:
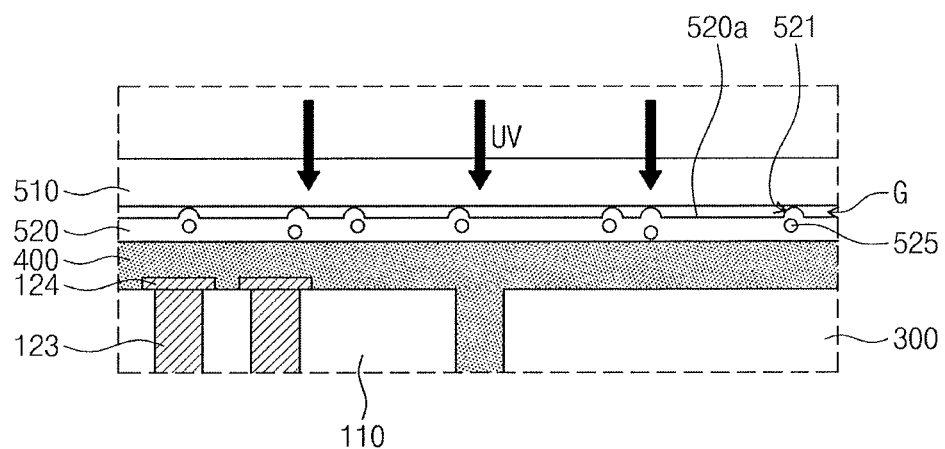
FIGS. 3A to 3C illustrate enlarged views of section A shown in FIG. 2G.
Figure 3B:
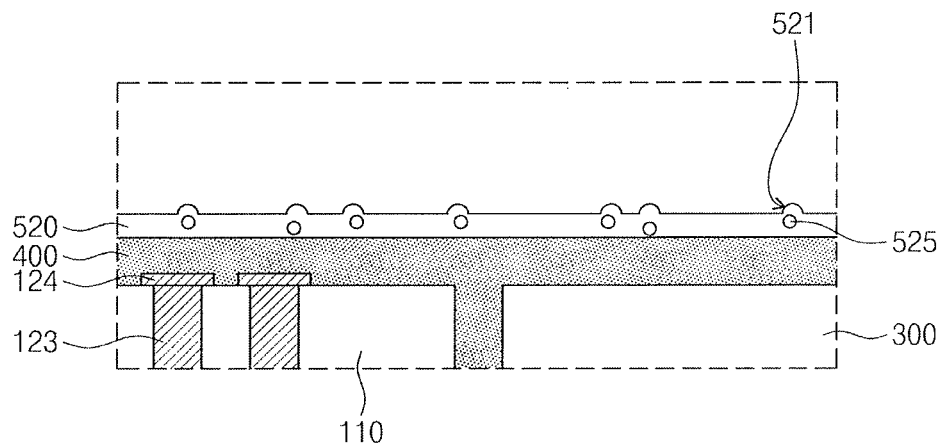
Figure 3C:
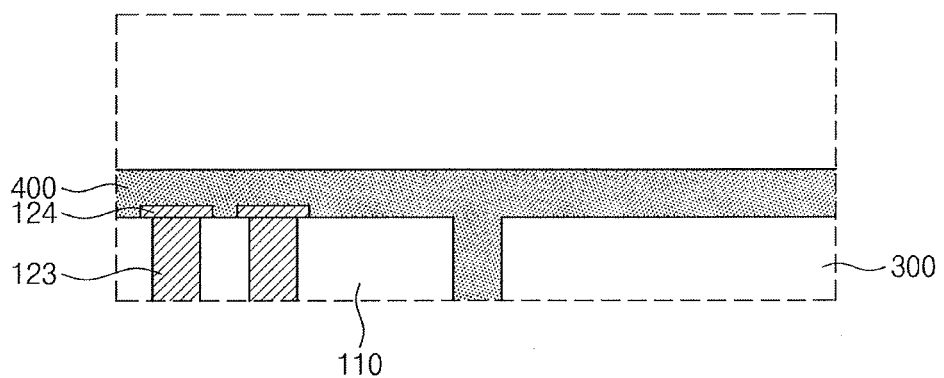

The detachment of the second carrier substrate 510 will be hereinafter described in detail with reference to FIGS. 3A to 3C. FIGS. 3A to 3C illustrate enlarged views of section A shown in FIG. 2G.

Referring to FIG. 3A, a protrusion 521 may be formed on a top surface 520a of the adhesive layer 520. For example, an ultraviolet (UV) ray may be irradiated onto the second carrier substrate 510. The UV ray may pass through the second carrier substrate 510 to reach the adhesive layer 520. The adhesive layer 520 may be foamed to form bubbles 525 in the adhesive layer 520. As viewed in plan, the bubbles 525 may be irregularly formed on an entire surface of the adhesive layer 520. As the adhesive layer 520 includes the bubbles 525 formed therein, a top surface 520a of the adhesive layer 520 may partially protrude in the third direction D3 such that a plurality of protrusions 521 may be formed. For example, the bubbles 525 may cause a portion of the adhesive layer 520 to protrude from a planar second carrier substrate facing surface 520a of the adhesive layer to form the protrusions 521. The protrusions 521 may push the second carrier substrate 510 in the third direction D3. For example, the protrusions 521 may cause to form a gap G between the second carrier substrate 510 and the adhesive layer 520. For example, the protrusions 521 may space the second carrier substrate 510 apart from the planar second carrier substrate facing surface 520a of the adhesive layer 520. For example, detaching the second carrier substrate 510 may include reducing a contact area between the adhesive layer 520 and the second carrier substrate 510.

Referring to FIG. 3B, the second carrier substrate 510 may be detached. For example, the protrusions 521 may separate the second carrier substrate 510 from the adhesive layer 520. An adhesive force between the second carrier layer 510 and the adhesive layer 520 may be removed or drastically reduced, so that the second carrier substrate 510 may be released without being damaged.

Referring to FIG. 3C, the adhesive layer 520 may be removed. For example, the adhesive layer 520 may be removed by an ultraviolet (UV) curing, a thermal slide de-bonder, a laser etching, a mechanical delamination, or a dissolution method.

FIGS. 3A to 3C show one example of how the second carrier substrate 510 is detached by the adhesive layer 520 including the UV blowing agent. In an implementation, the adhesive layer 520 may include a thermal curing agent that forms the bubbles 525 by irradiation of heat, and the second carrier substrate 510 may be separated identically to that discussed above with reference to FIGS. 3A to 3C.

In a method of manufacturing a semiconductor package according to exemplary embodiments of the present disclosure, the second carrier substrate 510 may be separated from the adhesive layer 520 by the protrusions 521 formed on the entire surface of the adhesive layer 520, and thereby an adhesive force of the adhesive layer 520 may be removed or reduced without a physical force applied from outside. It therefore may be possible to easily detach the second carrier substrate 510 from the first molding layer 400 and to help prevent a semiconductor package from warping during detaching of the second carrier substrate 510. In an implementation, the second carrier substrate 510 may be free of damage such that recycling of the second carrier substrate 510 may be possible.

Referring back to FIGS. 1A and 2H, after the second carrier substrate 510 and the adhesive layer 520 are removed, openings 401 may be formed in the first molding layer 400 through which the upper pads 124 are exposed. In an implementation, the openings 401 may not be formed.

Referring to FIGS. 1A, 1B, and 2I, the first substrate 600 and the interconnect substrate 100 may be sawed to form first packages P100. When the sawing process is performed, the first substrate 600 and the interconnect substrate 100 may be sawed along a sawing line SL illustrated in FIG. 2H. Each of the first packages P100 may have a cross-section like that shown in FIG. 2I.

Figure 2J:
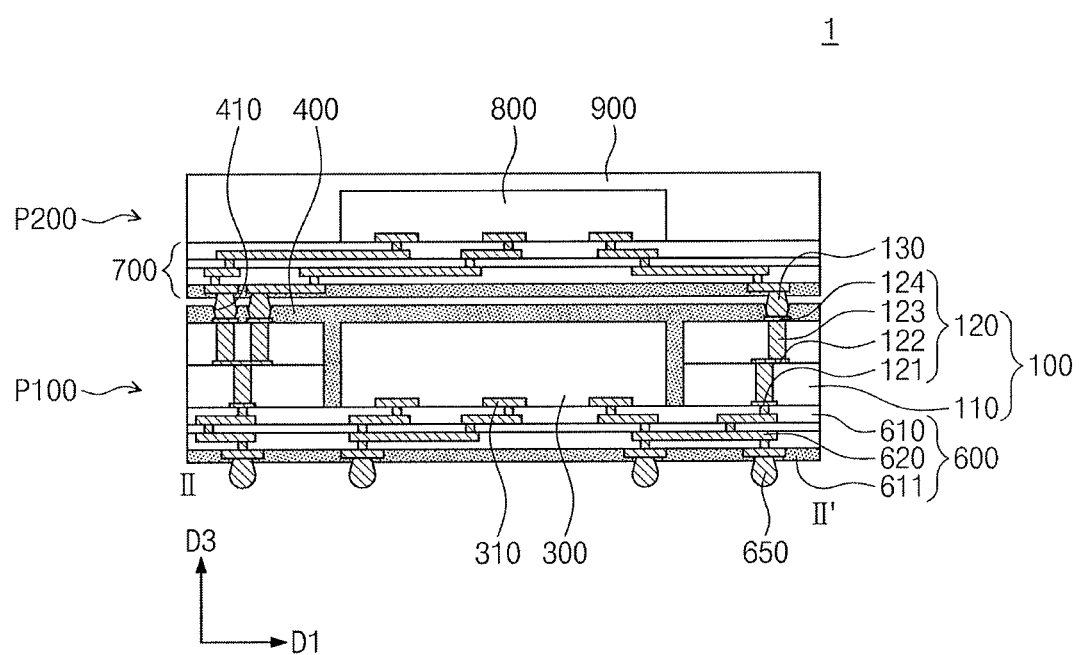

Referring to FIGS. 1B and 2J, a second package P200 may be mounted on the first package P100 of FIG. 2I and thus a semiconductor package 1 may be manufactured. The second package P200 may include a second substrate 700, a second semiconductor chip 800, and a second molding layer 900. In an implementation, the second semiconductor chip 800 may be mounted on the second substrate 700 in a flip-chip manner. In an implementation, the second semiconductor chip 800 may be electrically connected through a bonding wire to the second substrate 700. In an implementation, the second molding layer 900 may cover the second semiconductor chip 800 on the second substrate 700. Interconnect terminals 130 may be provided on a bottom surface of the second substrate 700. The interconnect terminals 130 may be coupled to the upper pads 124 and therefore the second package P200 may be electrically connected to the first package P100.

By way of summation and review, it may be difficult to adhere, handle, and test solder balls due to the small size of the semiconductor chip. Additionally, acquiring a diversified mount board in accordance with the size of the semiconductor chip may be difficult. A fan-out panel level package may be used. However, the semiconductor package may be susceptible to warpage due to its compact size.

In a method of manufacturing a semiconductor package according to exemplary embodiments of the present disclosure, the second carrier substrate may be spaced apart from the adhesive layer by the protrusions formed at an entire surface of the adhesive layer, and thereby an adhesive force of the adhesive layer may be removed without a physical force applied from outside. It therefore may be possible to easily detach the second carrier substrate from the first molding layer and to help prevent a semiconductor package from warping during detaching of the second carrier substrate. In addition, the second carrier substrate may be free of damage such that a recycling of the second carrier substrate may be possible.

The embodiments may provide a semiconductor package and a method of manufacturing the same that include a redistribution substrate.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A method of manufacturing a semiconductor package, the method comprising:
   providing an interconnect substrate;
   providing a molding layer on the interconnect substrate such that the molding layer fixes semiconductor chips;
   providing an adhesive layer and a carrier substrate on the molding layer;
   forming a redistribution substrate on the interconnect substrate and the semiconductor chips;
   forming a protrusion on the adhesive layer that protrudes from a top surface of the adhesive layer to space the second carrier substrate apart from the top surface of the adhesive layer;
   detaching the carrier substrate from the adhesive layer; and
   removing the adhesive layer.

2. The method as claimed in claim 1, wherein:
   forming the protrusion includes forming a bubble inside the adhesive layer, and
   the bubble causes a portion of the adhesive layer to protrude from the top surface of the adhesive layer.

3. The method as claimed in claim 2, wherein the adhesive layer includes an ultraviolet (UV) blowing agent or a heat blowing agent.

4. The method as claimed in claim 1, wherein removing the adhesive layer includes performing an ultraviolet (UV) curing, a thermal slide de-bonder, a laser etching, a mechanical delamination, or a dissolution method.

5. The method as claimed in claim 1, wherein providing the molding layer includes:
forming holes in the interconnect substrate;
providing a dummy substrate below the interconnect substrate;
providing the semiconductor chips in the holes and on the dummy substrate exposed through the holes;
forming the molding layer on the semiconductor chips, the dummy substrate, and the interconnect substrate; and
removing the dummy substrate.

6. A method of manufacturing a semiconductor package, the method comprising:
providing an interconnect substrate and a semiconductor chip on a first carrier substrate;
forming a molding layer by coating a molding composition on the semiconductor chip and the interconnect substrate;
adhering a second carrier substrate onto the molding layer with an adhesive layer;
removing the first carrier substrate to expose a surface of the semiconductor chip and the interconnect substrate;
forming a redistribution substrate on the exposed surfaces of the semiconductor chip and interconnect substrate;
detaching the second carrier substrate from the adhesive layer by reducing a contact area between the adhesive layer and the second carrier substrate; and
removing the adhesive layer,
wherein reducing the contact area between the adhesive layer and the second carrier substrate includes forming a protrusion that protrudes from a planar second carrier substrate facing surface of the adhesive layer.

7. The method as claimed in claim 6, wherein the protrusion that protrudes from the planar second carrier substrate facing surface of the adhesive layer spaces the second carrier substrate apart from the planar second carrier substrate facing surface of the adhesive layer.

8. The method as claimed in claim 6, wherein reducing the contact area between the adhesive layer and the second carrier substrate includes forming a gap between the second carrier substrate and a planar second carrier substrate facing surface of the adhesive layer.

9. The method as claimed in claim 6, wherein:
the adhesive layer includes a blowing agent, and
forming the protrusion includes foaming the blowing agent to form a bubble in the adhesive layer such that the bubble causes a portion of the adhesive layer to protrude from the planar second carrier substrate facing surface of the adhesive layer.

* * * * *